| (12) United States Patent | (10) Patent No.: US 8,421,499 B2 |
| Takayanagi et al. | (45) Date of Patent: Apr. 16, 2013 |

(54) POWER SWITCH RAMP RATE CONTROL USING PROGRAMMABLE CONNECTION TO SWITCHES

(75) Inventors: Toshinari Takayanagi, San Jose, CA (US); Shingo Suzuki, San Jose, CA (US); Jung-Cheng Yeh, San Jose, CA (US); Conrad H. Ziesler, Seattle, WA (US)

(73) Assignee: Apple Inc., Cupertino, CA (US)

( * ) Notice: Subject to any disclaimer, the term of this patent is extended or adjusted under 35 U.S.C. 154(b) by 639 days.

(21) Appl. No.: 12/705,837

(22) Filed: Feb. 15, 2010

(65) Prior Publication Data

US 2011/0198942 A1 Aug. 18, 2011

(51) Int. Cl.
*H03K 19/23* (2006.01)
(52) U.S. Cl.
USPC .................................. 326/33; 326/93; 326/95
(58) Field of Classification Search ............... 326/21, 326/32–33, 93–98
See application file for complete search history.

(56) References Cited

U.S. PATENT DOCUMENTS

| 6,980,042 | B2 | 12/2005 | LaBerge |
| 7,046,052 | B1 | 5/2006 | Percey |
| 7,126,370 | B2 | 10/2006 | Bhattacharya |
| 7,190,187 | B2 | 3/2007 | Hua et al. |
| 7,304,512 | B2 | 12/2007 | Duvillard |
| 7,411,423 | B2 | 8/2008 | Berthold et al. |
| 7,420,388 | B2 | 9/2008 | Bhattacharya |
| 7,479,801 | B2 * | 1/2009 | Bhattacharya ................. 326/33 |
| 7,545,177 | B1 * | 6/2009 | Kao et al. ...................... 326/95 |
| 7,605,631 | B2 | 10/2009 | LaBerge |
| 7,659,746 | B2 | 2/2010 | Chua-Eoan et al. |
| 7,716,609 | B1 | 5/2010 | Taheri |
| 8,026,741 | B2 | 9/2011 | Takayanagi |
| 8,120,208 | B2 | 2/2012 | Takayanagi |
| 8,362,805 | B2 | 1/2013 | Suzuki et al. |
| 2004/0184289 | A1 | 9/2004 | Vinciarelli |
| 2006/0055391 | A1 | 3/2006 | Kuang |
| 2006/0261855 | A1 | 11/2006 | Hillman et al. |
| 2008/0093632 | A1 | 4/2008 | Sakurabayashi |
| 2009/0066164 | A1 | 3/2009 | Flynn et al. |
| 2009/0160253 | A1 | 6/2009 | Rao et al. |
| 2009/0268531 | A1 | 10/2009 | Nii et al. |

OTHER PUBLICATIONS

U.S. Appl. No. 12/879,772, filed Sep. 10, 2010.

(Continued)

*Primary Examiner* — Vibol Tan
(74) *Attorney, Agent, or Firm* — Lawrence J. Merkel; Meyertons, Hood, Kivlin, Kowert & Goetzel, P.C.

(57) ABSTRACT

In an embodiment, an integrated circuit includes a power gated block and a power manager circuit. The power manager circuit is configured to provide a block enable signal and at least one select signal to the power gated block. The power manager may generate the select signal responsive to various parameters that affect the speed of the integrated circuit, such as power supply voltage magnitude, operating temperature, and/or process corner. The power gated block may control the rate at which power switches are enabled based on the select signal or signals. For example, the power switches may be enabled in a more parallel or more serial fashion and/or the drive strength of block enable buffering to the power switches may be varied. In another embodiment, the power manager circuit may assert multiple block enables to the power gated block (which are connected to separate sets of power switches), and may control the timing of assertion of the enables to control the rate at which power switches are enabled.

23 Claims, 6 Drawing Sheets

OTHER PUBLICATIONS

International Search Report and Written Opinion in Application No. EP 11179367.5-2215 I 2429079 Issued on Sep. 26, 2012, pp. 1-7.
International Search Report and Written Opinion in Application No. PCT/US 11/48998 Issued on Jan. 10, 2012, pp. 1-8.
Office Action in U.S. Appl. No. 12/705,834 issued on Aug. 21, 2012.
J.B. Kuang, et al., "The Design and Implementation of a Low-Overhead Supply-Gated SRAM," IEEE, 2006, pp. 287-290.
U.S. Appl. No. 12/705,834, filed Feb. 15, 2010.

* cited by examiner

POWER SWITCH RAMP RATE CONTROL USING PROGRAMMABLE CONNECTION TO SWITCHES

BACKGROUND

1. Field of the Invention

This invention is related to the field of integrated circuits, and more particularly to supplying power to circuitry in integrated circuits.

2. Description of the Related Art

As the number of transistors included on an integrated circuit "chip" continues to increase, power management in the integrated circuits continues to increase in importance. Power management can be critical to integrated circuits that are included in mobile devices such as personal digital assistants (PDAs), cell phones, smart phones, laptop computers, net top computers, etc. These mobile devices often rely on battery power, and reducing power consumption in the integrated circuits can increase the life of the battery. Additionally, reducing power consumption can reduce the heat generated by the integrated circuit, which can reduce cooling requirements in the device that includes the integrated circuit (whether or not it is relying on battery power).

Clock gating is often used to reduce dynamic power consumption in an integrated circuit, disabling the clock to idle circuitry and thus preventing switching in the idle circuitry. While clock gating is effective at reducing the dynamic power consumption, the circuitry is still powered on. Leakage currents in the idle transistors lead to static power consumption. The faster transistors (those that react to input signal changes, e.g. on the gate terminals) also tend to have the higher leakage currents, which often results in high total leakage currents in the integrated circuit, especially in high performance devices.

To counteract the effects of leakage current, some integrated circuits have implemented power gating. With power gating, the power to ground path of the idle circuitry is interrupted, reducing the leakage current to near zero. There can still be a small amount of leakage current through the switches used to interrupt the power, but it is substantially less than the leakage of the idle circuitry as a whole.

Power gating presents challenges to the integrated circuit design. As blocks are powered up and powered down, the change in current flow to the blocks can create noise on the power supply connections. The noise can affect the operation of the integrated circuit, including causing erroneous operation. Additionally, the rate of change in the current flow varies with process variations in the semiconductor fabrication process, and can also vary with the magnitude of the supply voltage supplied to the integrated circuit and with the operating temperature of the integrated circuit. When these factors slow the rate of change of the current, the delay to enable a power gated block increases. Accordingly, balancing the delay to enable the power gated blocks and the power supply noise is challenging. Typically, power switches within a given circuit block are connected in a serial chain to receive the enable control, and the delay of the serial chain is long enough to reduce power supply noise to an acceptable level at faster operating conditions.

SUMMARY

In an embodiment, an integrated circuit includes a power gated block and a power manager circuit. The power manager circuit is configured to provide a block enable signal to the power gated block, and is also configured to provide at least one select signal. The power manager may generate the select signal responsive to various parameters that affect the speed of the integrated circuit, such as power supply voltage magnitude, operating temperature, and/or process corner parameters. The power gated block may control the rate at which power switches are enabled based on the select signal or signals. For example, the power switches may be enabled in a more parallel or a more serial fashion based on the select signals and/or the drive strength of block enable buffering to the power switches may be varied based on the select signals. In another embodiment, the power manager circuit may assert multiple block enables to the power gated block (which are connected to separate sets of power switches), and may control the timing of assertion of the enables to control the rate at which power switches are enabled.

By detecting parameters that affect the speed of the integrated circuit and adjusting the rate at which power switches in a power gated block are enabled, the delay to enable the block and the noise created on the power supply during the enabling of the block may both be controlled in an embodiment. At a given operating point, acceptable delay and noise characteristics in the integrated circuit may be achieved, in some embodiments.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
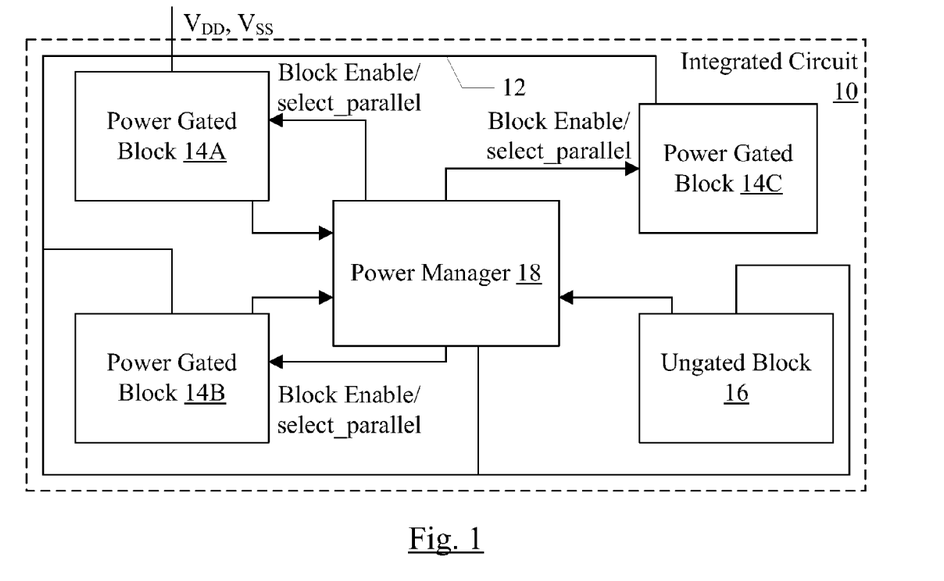
FIG. 1 is a block diagram of one embodiment of an integrated circuit.

Turning now to FIG. 1, a block diagram of one embodiment of an integrated circuit 10 is shown. The integrated circuit 10 is coupled to receive power supply inputs (e.g. $V_{DD}$ and $V_{SS}$, or power and ground, respectively). The $V_{DD}$ voltage may have a specified magnitude measured with respect to ground/$V_{SS}$ during use. More particularly, the $V_{DD}$ voltage may have a number of magnitudes that may be used for different operating points of the integrated circuit 10 during use. The integrated circuit 10 may include an interconnect, e.g. a global power supply grid, for each supply voltage, to distribute the voltage over an area occupied by the integrated circuit 10 (e.g. an area at the surface of a semiconductor substrate such as silicon). The global power supply grids are illustrated in FIG. 1 as the line 12 coupled to the blocks 14A-14C, 16, and 18 in FIG. 1. However, the grids may physically be arranged in a somewhat regular fashion, as described in more detail below.

The integrated circuit 10 may include one or more power gated circuit blocks such as blocks 14A-14C. Each block 14A-14C may include circuitry such as transistors that are arranged to implement the desired operations of the integrated circuit 10, and thus may be circuit blocks (although sometimes referred to herein as simply "blocks" for brevity). For example, the blocks 14A-14C may be processors or portions thereof (e.g. execution units within the processors); interface circuitry; peripheral circuitry such as graphics processing circuitry; user interface circuitry; multimedia circuitry such as audio and/or video processing circuitry; etc.

Generally, a circuit block may include a set of related circuits that implement one or more identifiable operations. The related circuits may be referred to as logic circuits or logic circuitry, since the circuits may implement logic operations on inputs to generate outputs. Because the circuits in a given circuit block are related, they may be powered up or powered down as a unit. Each circuit block may generally be treated as a unit during the design of the integrated circuit (e.g. being physically placed within the integrated circuit as a unit). The circuit block may further include memory circuitry (e.g. various static random access memories, or SRAMs) and other storage devices that are part of the logic circuitry.

A power gated circuit block (or simply a power gated block) may be a circuit block that may have at least one of its power supply voltages ($V_{DD}$ or $V_{SS}$) interrupted in response to deassertion of a block enable input signal. The power gated blocks may include power switches that are coupled to the global power supply grid and to a local power supply grid. If the enable is asserted, the power switches may electrically connect the global and local power supply grids. If the enable is deasserted, the power switches may electrically isolate the global and local power supply grids. When electrically connecting the grids, the power switch may be referred to as being on, and when electrically isolating the grids, the power switch may be referred to as being off. The voltage on the global power supply grid may appear on the local supply grid when electrically connected. However, the switches may have some impedance, and thus the voltage on the local power supply grid may differ from the voltage on the global power supply grid at times. The local supply voltage may be referred to as "virtual" (e.g. virtual $V_{DD}$ or virtual $V_{SS}$).

When a power gated block 14A-14C is enabled, the power switches turn on and current flows to charge the local power supply grid in the power gated block 14A-14C. In order to reduce the rate of change of current (di/dt) on the global power supply grids, which may generate enough noise to cause erroneous behavior in other circuitry in some cases, the power gated block 14A-14C may control the rate at which the power switches are enabled. The rate at which the local power supply grid is charged to full voltage (the "ramp rate") may depend upon the rate at which the power switches are enabled, because each power switch may have a given current capacity when turned on. Accordingly, the amount of time that elapses to power up the power gated block 14A-14C to be ready for use may depend on the rate at which the power switches are enabled. Similarly, the amount of power supply noise generated during the enablement of the block may depend on the rate at which the power switches are enabled. Particularly, in the illustrated embodiment, the power gated blocks 14A-14C may receive one or more select signals (e.g. select_parallel in FIG. 1) in addition to the block enable. In one embodiment, the power gated block 14A-14C may enable subsets of the power switches in parallel in response to assertion of the select_parallel signal, thus increasing the ramp rate as compared to enabling the power switches in a more serial fashion. If the select_parallel signal is deasserted, the power switches may be enabled serially. In some embodiments, more than one select_parallel signal may be supported, providing additional granularity in the serial or parallel enablement of the power switches.

In one embodiment, a power manager circuit 18 (or more briefly, the power manager 18) is coupled to the blocks 14A-14C and 16, and may be configured to monitor the activity in the blocks 14A-14C and 16 to generate the block enables for the power gated blocks 14A-14C. The activity in one block may be an indicator that another block is about to become active and should be powered up. For example, the blocks 14A-14C and 16 may be part of a pipeline. If one pipeline stage is active, it may be likely that the next stage will be active soon. Similarly, in a processor, a fetch request may indicate that instructions will be fetched and decoded soon, and thus the execution units may be powered up. Power gated blocks may be components of a system on a chip, and a communication from one component to another may indicate that a block may need to be powered up. Activity in a block may also indicate that the block or another block is about to be idle and may be powered down. In some embodiments, blocks may be enabled or disabled under software control, and the power manager 18 may power up or power down blocks 14A-14C responsive to software commands, software programming of control registers in the power manager 18, etc. While the ungated block may not be enabled or disabled for power gating, its activity may be useful in determining if the power gated blocks may be disabled. In some embodiments, clock gating may be implemented in addition to power gating. In such embodiments, the power manager 18 may also implement the clock gating, or the clock gating may be implemented separately. While the power manager is shown as a block in FIG. 1, the power manager 18 may actually be distributed as desired.

Additionally, the power manager 18 may be configured to generate the select_parallel signal (or signals). The power manager 18 may detect various parameters that indicate the speed at which circuitry in the integrated circuit 10 may operate. Particularly, the parameters may indicate the current capability of the power switches, and thus the speed at which the local power supply grid is charged. For example, higher $V_{DD}$ magnitudes (with respect to $V_{SS}$) may indicate higher current capability/faster charging and lower $V_{DD}$ magnitudes may indicate slower charging. Accordingly, for lower $V_{DD}$ magnitudes, more parallel enabling of power switches may be supported since the lower current capability may translate to a lower di/dt rate per enabled switch. Additionally, the lower $V_{DD}$ magnitude may indicate that buffering between the block enable and the power switches may operate more slowly, lowering the di/dt by enabling buffered power switches more slowly. By enabling power switches in parallel, the delay for power up the block may be reduced and di/dt effects may increase but may remain within constraints.

In some embodiments, operating temperature of the integrated circuit 10 may also be detected, where higher operating temperatures may indicate slower operation (and thus more parallel enabling of the power switches may be used). Process parameters that were in effect in the semiconductor fabrication process when the integrated circuit 10 was manufactured (e.g. the parameters may indicate a "fast" process, a "typical" process, or a "slow" process) may also be detected (e.g. they may be fused into the integrated circuit 10 or otherwise made available). Fast process parameters may indicate that more serial enabling of the power switches should be used, and slower process parameters may indicate that more parallel enabling of the power switches should be used.

Generally, the power manager 18 may be configured to deassert the block enable to power down a block, and to assert the block enable to power up a block. The block enable (and other signals described herein) may be asserted at one logical state and deasserted at the other logical state. For example, the signal may be asserted (indicating enable) at a low logical state (binary zero) and deasserted at a high logical state (binary one). The signal may alternatively be deasserted at the low logical state and asserted at the high logical state. Different signals may have different asserted/deasserted definitions. In some contexts, a signal may be referred to as asserted low, or alternatively asserted high, for additional clarity.

In various embodiments, a period of time may elapse after a power gated block 14A-14C has its block enable deasserted before the supply voltage has drained, and there may be a period of time after assertion of the enable before the power gated block is considered stable and ready for use. The power manager 18 may be configured to account for these times when determining if the block enable may be deasserted, and in determining when to reassert the block enable for the next power up of the block.

The electrical isolation of the local and global power supply grids that may be provided by the power switches may generally refer to a lack of active current flow between the grids. The power switches themselves may have leakage current, so there may be some leakage current flow. Similarly, the electrical connection of the local and global power supply grids may refer to an active current flow between the grids to provide the voltage from the global grid to the local grid. Viewed in another way, electrically connected grids may have a very low impedance path between them, whereas electrically isolated grids may have a very high impedance path. Viewed in still another way, electrically connected grids may be actively passing a voltage from one grid to the other, wherein electrically isolated grids may be preventing the passing of the voltage.

The local and global power supply grids may generally distribute a power supply voltage over various areas of the integrated circuit 10. The global power supply grids distribute the voltage over the entire area of the integrated circuit 10, while local power supply grids distribute power supply voltages within a power gated block. The ungated blocks may also include local power supply grids, but since they do not include power switches, the local power supply grids may essentially be part of the global power supply grid. In general, the power supply grids may have any configuration. For example, in one embodiment, a given block may have power supply connections to the underlying circuitry at certain physical locations (e.g. regularly spaced channels over the area). The power supply grids may include wiring running above these regularly spaced channels. There may also be wires running in the orthogonal direction to the wiring, to reduce impedance and to supply current to any localized current "hot spots". Other grids may include any sort of distribution interconnect and/or there may be irregularities in the grids, or the interconnect may essentially be a plane of metal. In one embodiment, the global power supply grids may be provided in one or more of the highest layers of metal (wiring layers), i.e. those layers that are farthest from the surface of the semiconductor substrate. The local power supply grids may be included in lower layers of metal. Connections between the power supply grids may be made to the power switches at a surface of the semiconductor substrate. The metal may be any conductive material used for interconnect in the semiconductor fabrication process used to fabricate the integrated circuit 10. For example, the metal may be copper, aluminum, tungsten, combinations thereof (e.g. aluminum or copper wiring layers and tungsten vias), alloys thereof, etc.

The power supply voltages ($V_{DD}$ and $V_{SS}$) may generally be externally supplied to the integrated circuit, and may be generally intended to be relatively static during use. While the magnitude of the supply voltages may be intentionally changed during use (e.g. for power management), the magnitude changes are not intended to be interpreted by receiving circuits in the fashion that dynamically varying signals are interpreted. Similarly, local variations in the power supply voltages may occur (such as $V_{DD}$ droop or $V_{SS}$ bounce) during operation, but these variations may generally be undesirable transients. The power supply voltages may serve as sources and sinks of current as the circuitry evaluates.

As mentioned above, the power gated blocks 14A-14C may have their power gated, e.g. when inactive, to reduce power consumption in the integrated circuit. According, the power gated blocks 14A-14C are each coupled to receive an enable signal (block enable in FIG. 1). The block enable signal for each block may be a separate, unique signal for that block, so that the power gated blocks 14A-14C may be individually enabled or not enabled. In some cases, one or more power gated blocks may share an enable. A shared block enable may be physically the same signal, or logically the same signal (i.e. the signals are physically separate but logically operated the same way). The integrated circuit 10 may also include one or more ungated circuit blocks such as ungated block 16. Ungated blocks may be coupled to the power supply grids 12 without any power switches, and thus may be powered up whenever the integrated circuit 10 is powered up. Ungated blocks may be blocks that are active most or all of the time, so that including the power switches and attempting to power gate them is not expected to produce much power savings, if any, for example.

It is noted that, while one ungated block and three power gated blocks are shown in FIG. 1, there may generally be any number of one or more power gated blocks and ungated blocks, in various embodiments. Similarly, there may be more than one power manager 18 in the integrated circuit 10 (e.g. enabling/disabling various non-overlapping subsets of the power gated blocks).

It is noted that one or more circuit blocks may include state storage (e.g. memory, flops, registers). It may be desirable to retain the state in the state storage (or some of the state storage). In such cases, the global power grids may supply power to the state storage without power switches in the power to ground path. A separate local power grid may be provided, for example, without power switches.

Figure 2:
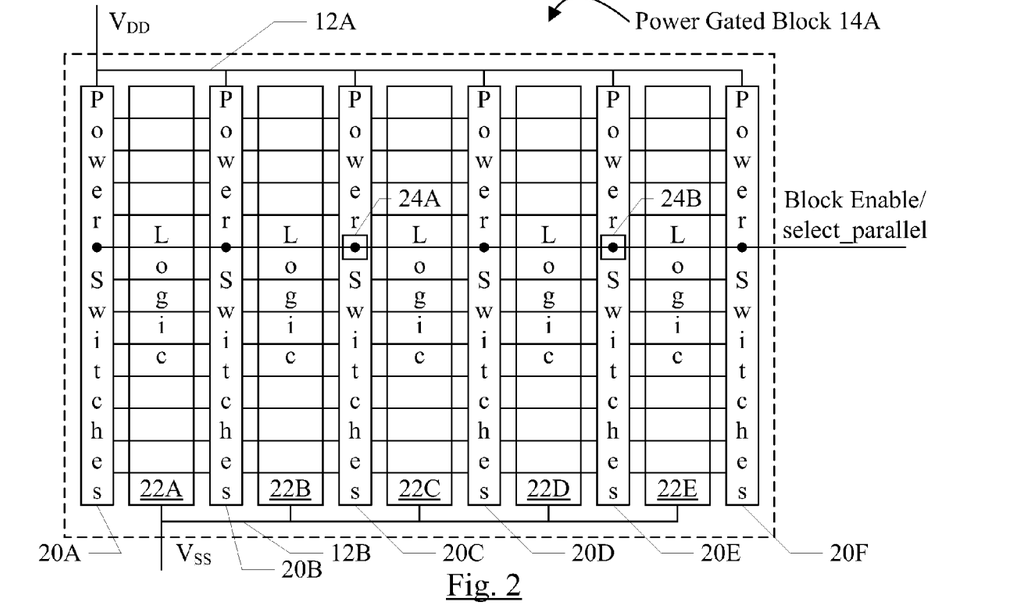
FIG. 2 is a block diagram of one embodiment of a power gated block shown in FIG. 1.

Turning now to FIG. 2, a block diagram of one embodiment of the power gated block 14A is shown. Other power gated blocks 14B-14C may be similar. In the embodiment of FIG. 2, the power gated block 14A includes multiple power switches located at a variety of physical locations within the power gated block 14A. That is, the power switches may be physically distributed over the area occupied by the power gated block 14A. In this embodiment, the power switches are placed at regularly spaced intervals, although other distributions that are not regular may be used in other embodiments. Each location may include multiple power switches (e.g. power switch segment 20A may include multiple power switches). The power switches at one location may be referred to as a segment of power switches 20A-20F. The power gated block 14A further includes enable control circuits distributed across the power gated block 14A (e.g. the enable control circuits 24A-24B near the power switch segments 20C and 20E). The physical location of the enable control circuits 24A-24B may vary, and there may be more enable control circuits 24A-24B in other embodiments. For example, an embodiment is contemplated in which there is one enable control circuit for each power switch segment 20B-20F. Alternatively, there may be more than one enable control circuit per power switch segment, or less than one enable control circuit per power control segment with a different distribution. The block enable and select_parallel signals for the power gated block 14A are coupled to the enable control circuits 24A-24B. Additionally, the block enable signal is directly coupled to the power switch segment 20A in this embodiment. The select_parallel signal may, in some embodiments, be coupled to each power switch segment 20A-20F.

In this embodiment, the power switches are coupled between the global $V_{DD}$ grid 12A and the local $V_{DD}$ grid of the power gated block 14A. The local $V_{DD}$ grid is illustrated as the horizontal lines in FIG. 2 between the power switch segments 20A-20F. Between each of the power switch segments 20A-20F, logic circuits 22A-22E are provided. The logic circuits 22A-22E may be powered by the local $V_{DD}$ grid, and also by the local $V_{SS}$ grid which is not shown in FIG. 2. The global $V_{SS}$ grid 12B is shown coupled to each of the logic circuits 22A-22E, but there may generally be a local $V_{SS}$ grid to which the global $V_{SS}$ grid 12B is coupled. While FIG. 2 shows the power switch segments 20A and 20F at the edges of the power gated block 14A with no circuitry between the edges of the power gated block 14A and the power switch segments 20A and 20F, these power switch segments may not necessarily be placed at the very edges. In other words, logic circuits may be placed to the left of the power switch segment 20A in FIG. 2 and/or to the right of power switch segment 20F in FIG. 2.

The enable control circuits 24A-24B may generate local block enables for at least some of the power switch segments responsive to the block enable and select_parallel signal(s) from the power manager 18. Particularly, the enable control circuits 24A-24B may generate the local block enable signals directly from the global block enable signal provided by the power manager 18 responsive to assertion of the select_parallel signal. Thus, various power segments 20A-20F may be enabled in a more parallel fashion if the select_parallel signal is asserted. For example, in the illustrated embodiment, the power segments 20A, 20C, and 20E may be enabled in parallel (although there may be some skew in the timing of the enables due to propagation delays and delays in the logic circuitry in the enable control circuits 24A-24B). In cases in which various parameters (e.g. process, voltage, and temperature, or PVT) indicate slower operation in the integrated circuit 10, the select_parallel signal may be asserted to reduce the ramp time as compared to the time if serial enabling was used. Since the power switches may be operating slower, the resulting di/dt noise may still fall within specified limits, and the more parallel operation may permit more rapid activation of the power-gated block. For example, the delay may be comparable to the delay for serial enabling of the power switch segments when the PVT parameters indicate faster operation.

On the other hand, in cases in which the PVT parameters indicate faster operation in the integrated circuit 10, the select_parallel signal may be deasserted and serial enabling may be used. Using serial enabling when the PVT parameters indicate faster operation may ensure that the di/dt noise specifications are met. Since faster operation is occurring, the ramp delay may be lower than it would be for serial enabling with slower operations. Accordingly, using the select_parallel signal, the ramp delay and di/dt noise effects may be controlled according to the PVT parameters of the integrated circuit 10. As mentioned previously, more than one select_parallel signal may be used in other embodiments. An example will be discussed in more detail below with regard to FIG. 7.

The power switches may generally comprise any circuitry that may electrically connect a local power supply grid to a global power supply grid in response to an asserted enable signal and may electrically isolate the local power supply grid from the global power supply grid in response to a deasserted enable signal. For example, each power switch may be a P-type Metal-Oxide-Semiconductor (PMOS) transistor for embodiments that implement power switches on the $V_{DD}$ power supply grid. The gate of the PMOS transistor may be coupled to receive the (possibly buffered) local block enable signal, a source coupled to the global $V_{DD}$ grid 12A, and a drain coupled to one or more local $V_{DD}$ grid lines. Accordingly, the block enable signal may be asserted low in this example, turning the PMOS transistor 24 on and actively conducting current from the global $V_{DD}$ grid 12A to the local $V_{DD}$ grid lines. Embodiments which implement the power switches on the $V_{SS}$ grid may be similar, except that the transistor may be an N-type MOS (NMOS) transistor and the block enable may be asserted high/deasserted low in such embodiments. An enable control circuit may comprise any circuitry that is configured to generate a local block enable for one or more power switch segments 20A-20F.

Figure 3:
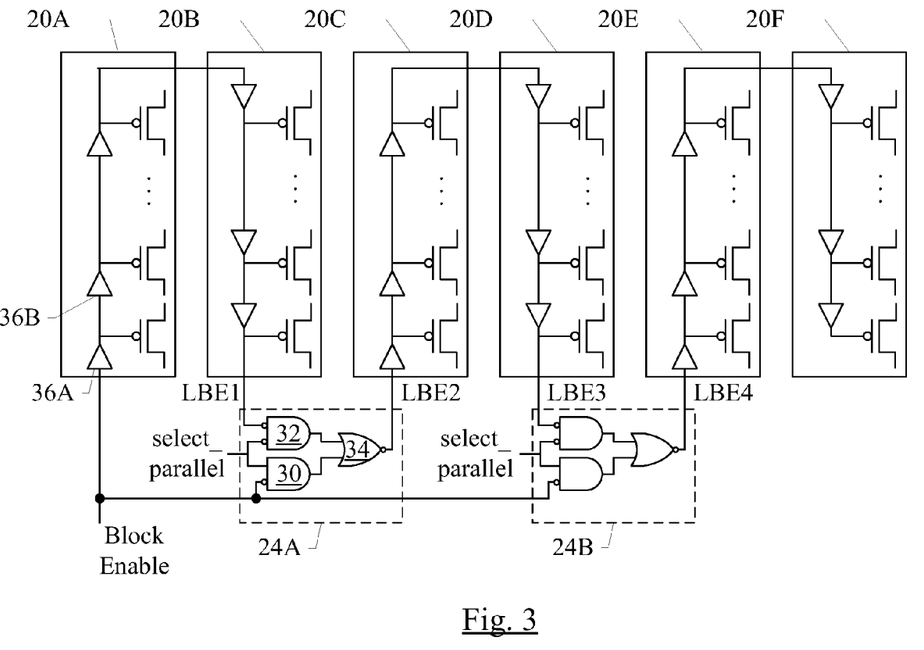
FIG. 3 is a block diagram illustrating one embodiment of power switches and corresponding enable control circuits for a power gated block shown in FIG. 2.

Turning next to FIG. 3, a block diagram illustrating one embodiment of the power switch segments 20A-20F and the enable control circuits 24A-24B in greater detail is shown. In the illustrated embodiment, the enable control circuits 24A-

24B include combinatorial logic configured to assert a local block enable in response to assertion of the global block enable received by the enable control circuits 24A-24B from the power manager 18 if the select_parallel signal is asserted. Additionally, the enable control circuits 24A-24B are coupled to receive a local block enable propagated from one of the power switch segments 20A-20F (e.g. the enable control circuit 24A is coupled to receive the local block enable LBE1 propagated from the power switch segment 20B and the enable control circuit 24B is coupled to receive the local block enable LBE3 propagated from the power switch segment 20D). The enable control circuits 24A-24B may be configured to assert the local block enable in response to the received local block enable if the select_parallel signal is deasserted. In the illustrated embodiment, a block enable is propagated through a power switch segment 20A, 20C, or 20E and the adjacent power switch segment 20B, 20D, or 20F, respectively. That is, the local block enable propagated through the power switch segment 20A is input to the power switch segment 20B; the local block enable propagated through the power switch segment 20C is input to the power switch segment 20D; and the local block enable propagated through the power switch segment 20E is input to the power switch segment 20F. As mentioned previously, in other embodiments, each power switch segment 20A-20F may receive its own local block enable or multiple local block enables. The power switch segment 20A is coupled to receive the global block enable from the power manager 18 directly. It is noted that the global block enable signal may refer to the block enable signal for the power gated block as a whole, in this discussion.

Accordingly, in the illustrated embodiment, if the select_parallel signal is deasserted, the global block enable may be received by the power switch segment 20A, which may propagate the block enable serially through the power switch segments 20A-20B, the enable control circuit 24A (LBE1), the power switch segments 20C-20D, the enable control circuit 24B (LBE3), and the power switch segments 20E-20F. If the select_parallel signal is asserted, the global block enable may be propagated through the power switch segments 20A-20B, the power switch segments 20C-20D, and the power switch segments 20E-20F in parallel. The latter two groups of power switch segments receiving their local block enables LBE2 and LBE4 from the enable control circuits 24A-24B, generated directly from the global block enable signal received by the enable control circuits 24A-24B in response to the select_parallel signal.

Specifically, the enable control circuit 24A may include an AND gate 30, an AND gate 32, and a NOR gate 34 in the illustrated embodiment. However, other embodiments may include any other circuitry including any Boolean equivalents of the illustrated circuit. The AND gate 30 is coupled to receive the global block enable on an inverting input and the select_parallel signal on non-inverting input. The AND gate 30 may assert its output in response to assertion of the select_parallel signal and assertion of the global block enable signal. Accordingly, the global block enable signal is asserted low and the select_parallel signal is asserted high in this embodiment. The AND gate 32 is coupled to receive the select_parallel signal and the local block enable LBE1 in this embodiment, both on inverting inputs. The AND gate 32 may assert its output in response to deassertion of the select_parallel signal and assertion of the LBE1 block enable signal. Thus, the LBE1 block enable signal is also asserted low in this embodiment. The NOR gate 34 is configured to assert (low) its output responsive to assertion of either output of AND gates 30 or 32, thus generating the local block enable LBE2 to the power switch segment 20C. The enable control circuit 24B is configured similarly with regard to the local block enable LBE3, the select_parallel signal, and the global block enable as inputs and the local block enable LBE4 to the power switch segment 20E in this embodiment.

Viewed in another way, the enable control circuits 24A-24B may be selection circuits that select between one (or more) received local block enables and the global block enable to generate the output local block enable. Accordingly, another embodiment of the enable control circuits 24A-24B may comprise a multiplexor having selection controls coupled to the select_parallel signal(s).

As illustrated in FIG. 3, the power switch segments 20A-20F may include buffering in addition to the power switches (e.g. the power switches may be the PMOS transistors shown in FIG. 3). The buffers may be coupled in series and may be coupled to receive an input block enable (e.g. the buffer 36A is coupled to receive the global block enable signal, the output of the buffer 36A may be the input to the buffer 36B, etc.). Any number of buffers and any number of power switches may be included in a given power switch segment, and different power switch segments may include different numbers of buffers and/or power switches. Each buffer may generally drive more than one power switch. Accordingly, the power switches in a power switch segment may be controlled by a given block enable signal. A power switch may be controlled by a given block enable signal if it is directly coupled to the given block enable signal or if it is coupled to receive a buffered version of the given block enable signal (i.e. the given block enable signal is logically the same signal but has been buffered). Thus, the local block enable signal LBE1 is a buffered version of the global block enable signal but the local block enable signal LBE2 is not a buffered version of the local block enable signal LBE1 since is not logically the same signal (since combinatorial logic in the enable control circuit 24A generates the local block enable signal LBE2 from the local block enable signal LBE1 and other signals).

Together, the buffers and the load of the power switches in each power switch segment 20A-20F may cause a delay in the propagation of the block enable signal through the power switch segment 20A-20F. In one embodiment, the power switch segments may be designed so that the propagation delay, in best case PVT conditions, presents a di/dt that is less than or equal to an acceptable di/dt for powering up the power gated block. Best case PVT may generally refer to the conditions that cause the circuitry response to be faster than the other combinations of conditions. That is, the best case process parameters may be parameters that produce circuits that respond the most rapidly. The best case voltage may be the highest supply voltage magnitude that is supported by the integrated circuit 10. The best case temperature may be the lowest temperature supported by the integrated circuit. Similarly, worst case PVT conditions may be the conditions that cause the circuitry to respond slower than other combinations. Thus, the worst case process parameters may produce circuits that respond slowly. The worst case voltage may be the lowest support voltage magnitude, and the worst case temperature may be the highest supported temperature.

Accordingly, if a power switch segment meets di/dt constraints at best case PVT conditions and the power switch segments are enabled serially, the enabling of the power switches at best case PVT conditions may meet the di/dt constraints. At other PVT conditions, the response of the power switch segments may be slower. Thus, the experienced di/dt may be even lower than the di/dt constraints and the ramp delay may be longer. At certain PVT conditions, the experienced di/dt may be low enough to permit parallel enabling of the power switch segments without violating the di/dt constrains, shortening the ramp delay. The power manager 18 may detect the PVT conditions that permit parallel enabling, and may assert the select_parallel signal in response. In some embodiments, subsets of the PVT conditions may be monitored (e.g. only the supply voltage magnitude may be monitored, only one of the other conditions may be monitored, or any subcombination of the conditions may be monitored).

The power switch transistors in a given power switch segment need not all be sized the same. For example, some power switch transistors may be sized small (e.g. small channel widths) which may have lower current capacity than larger transistors (e.g. large channel widths) but which may also have lower gate capacitance and thus may be turned on more rapidly. In some embodiments, the smaller transistors may be implemented with lower threshold voltages than the larger transistors as well. In one embodiment, the small transistors may be enabled first, generating a lower di/dt while the local power grid is charged, followed by the larger transistors.

Figure 4:
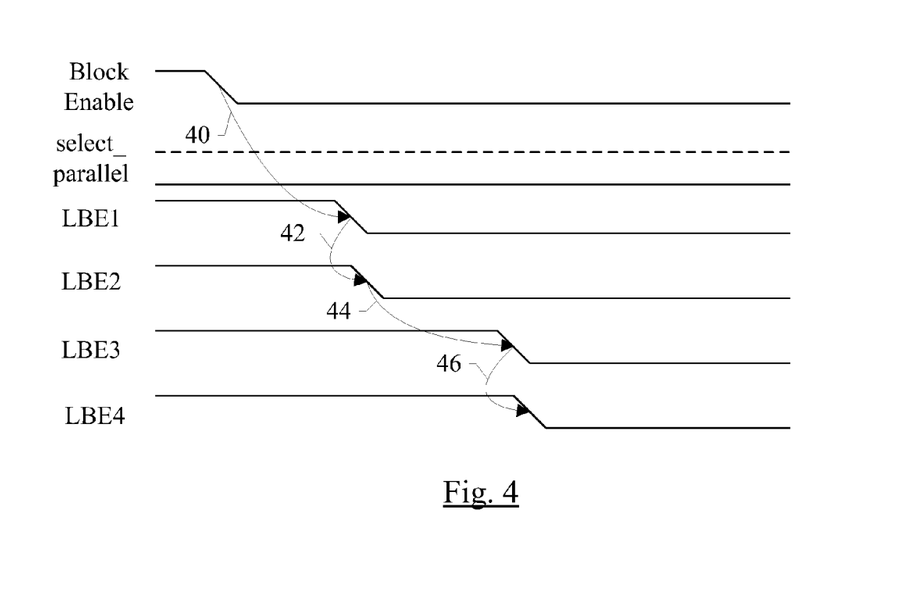
FIG. 4 is a timing diagram illustrating operation of one embodiment of enabling a power gated block.

FIG. 4 is a timing diagram illustrating operation of one embodiment of the power switch segments 20A-20F and the enable control circuits 24A-24B in response to a deasserted select_parallel signal. Time increases from left to right in FIG. 4, in arbitrary units. The global block enable from the power manager 18 may be asserted, and the select_parallel signal remains deasserted. The asserted global block enable propagates through the power switch segments 20A-20B to the LBE1 local block enable signal (arrow 40), experiencing the delay through the power switch segments 20A-20B. The local block enable signal LBE1 is selected by the enable control circuit 24A to generate the local block enable LBE2 responsive to the deasserted select_parallel signal (arrow 42). The local block enable LBE2 propagates to the local block enable LBE3 (arrow 44), experiencing the delay through the power switch segments 20C-20D. The local block enable LBE3 is selected by the enable control circuit 24B to generate the local block enable LBE4 (arrow 46). Accordingly, FIG. 4 illustrates a serial enabling of the power switch segments 20A-20F.

Figure 5:
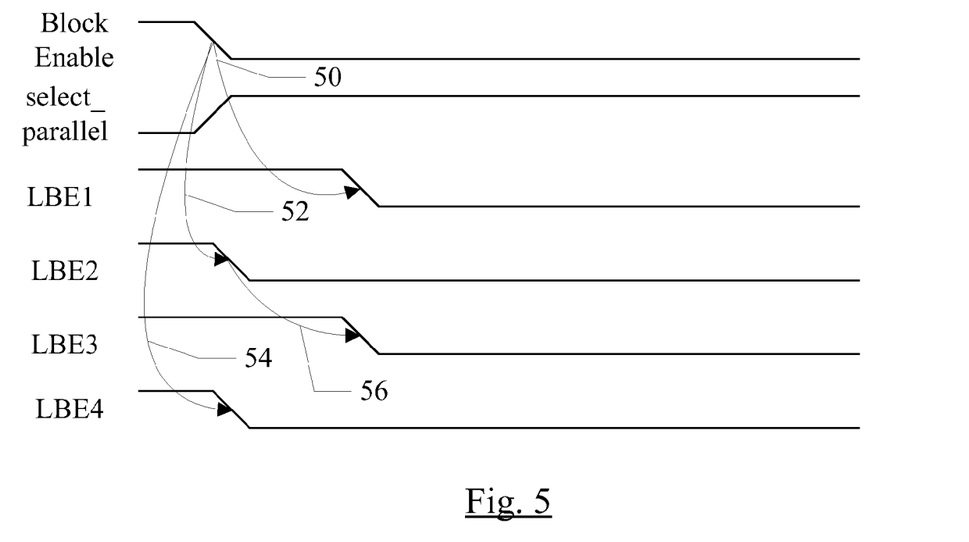
FIG. 5 is a second timing diagram illustrating operation of one embodiment of enabling a power gated block.

FIG. 5 is a timing diagram illustrating operation of one embodiment of the power switch segments 20A-20F and the enable control circuits 24A-24B in response to a asserted select_parallel signal. Time increases from left to right in FIG. 5, in arbitrary units. The global block enable from the power manager 18 may be asserted, and the select_parallel signal is also asserted. In addition to propagating through the power switch segments 20A-20B to the local block enable LBE1 (arrow 50), the global block enable signal is selected by the enable control circuits 24A-24B to generate the local block enable signals LBE2 and LBE4 (arrows 52 and 54, respectively). The block enable signal LBE2 propagates to the local block enable signal LBE3 (arrow 56) at approximately the same time as the local block enable LBE1. Accordingly, FIG. 5 illustrates a partially parallel enabling of the power switch segments 20A-20F.

Figure 6:
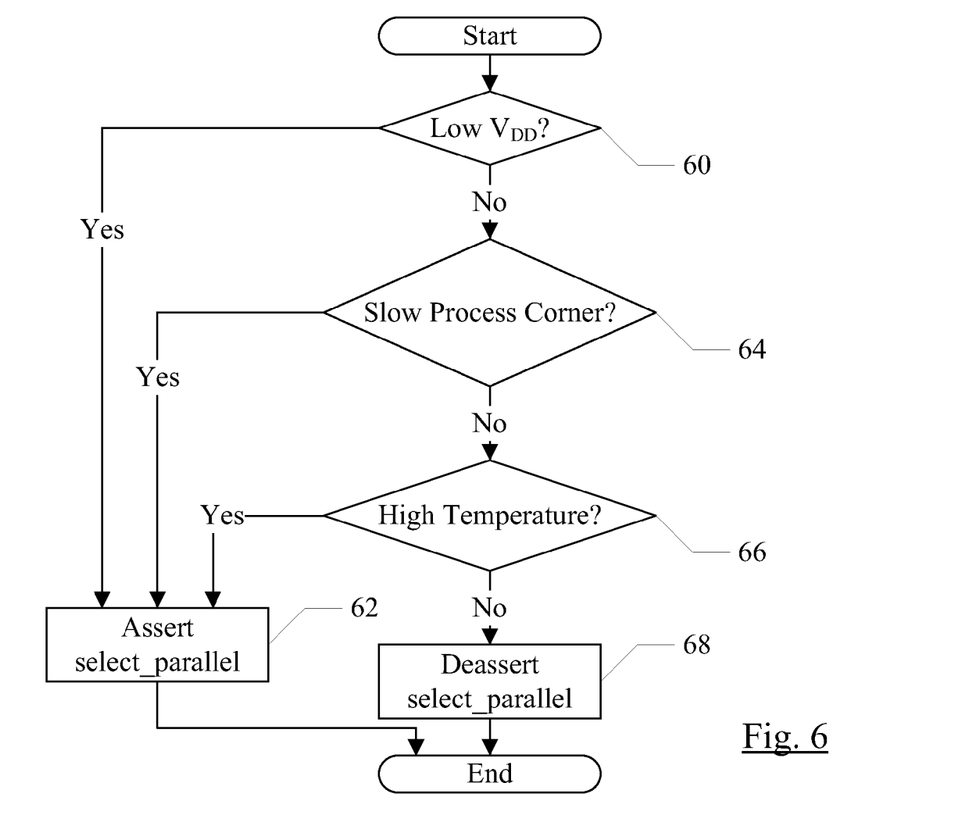
FIG. 6 is a flowchart illustrating operation of one embodiment of a power manager illustrated in FIG. 1.

Turning now to FIG. 6, a flowchart is shown illustrating operation of one embodiment of the power manager 18 in response to determining that a power gated block is to be powered up. In one embodiment, the power manager 18 may be implemented in hardware circuitry. In other embodiments, a portion or all of the power manager 18 may be implemented in software stored on a computer accessible storage medium. While the blocks are shown in a particular order for ease of understanding, other orders may be used. Blocks may be performed in parallel in combinatorial logic circuits in the power manager 18. Blocks, combinations of blocks, and/or the flowchart as a whole may be pipelined over multiple clock cycles.

The power manager 18 may monitor various parameters that indicate the PVT conditions of the integrated circuit 10. If one or more parameters indicate that the circuitry of the integrated circuit 10 may respond more slowly, the power manager 18 may cause the power up of a power gated block to be performed in a more parallel manner. If the parameters indicate that the circuitry may respond more rapidly, the power manager 18 may cause the power up to be performed in a more serial fashion. In one embodiment, the power manager 18 may monitor the parameters over time and may determine whether to enable power switch segments serially or in parallel at the time a power up is to occur. In other embodiments, the power manager 18 may both sense the parameters and determine serial/parallel enabling at the time a power up is to occur.

For example, the power manager may detect if the current supply voltage magnitude ($V_{DD}$) is "low" (decision block 60). The supply voltage magnitude may be considered low, for example, if it is lower than the maximum supported voltage, lower than a threshold voltage determined in hardware or programmable in the power manager 18, etc. If the supply voltage magnitude is low (decision block 60, "yes" leg), the power manager 18 may assert the select_parallel signal (block 62). The power manager 18 may also sense one or more process parameters related to the process corner that applies to the integrated circuit 10 (e.g. based on the process parameters that were in effect at the time the integrated circuit 10 was manufactured) (decision block 64). Data identifying the process corner may be available in the integrated circuit 10 (e.g. in the form of fuses blown during manufacture), and may be read by the power control code. If the process parameters indicate a slow process corner (decision block 64, "yes" leg), the power manager 18 may assert the select_parallel signal. The integrated circuit 10 may also make temperature measurements and make temperature data available power manager 18. If the temperature is "high", e.g. near the maximum temperature supported by the integrated circuit 10 (decision block 66, "yes" leg), the power manager 18 may assert the select_parallel signal (block 66). Otherwise (decision blocks 62, 64, and 66, "no" legs), the power manager 18 may deassert the select_parallel signal (block 68). Additionally, the power manager 18 may assert the global block enable for the power gated block that is being powered up (not shown in FIG. 6).

The embodiment illustrated in FIG. 6 asserts that select_parallel signal for any parameters that indicate slower operation. Other embodiments may assert the select_parallel signal only if a combination of parameters indicate slower operation, or based on the degree of slowness indicated by the parameters. Still further, embodiments which use more than one select_parallel signal may assert different signals dependent on different degrees of slowness indicated by the parameters. For example, a first select_parallel signal that provides a first amount of parallel enabling may be asserted in response to any parameter indicating slow circuit response, and a second select_parallel signal that provides additional parallel enabling may be asserted in response to a combination of parameters indicating slow circuit response.

Figure 7:
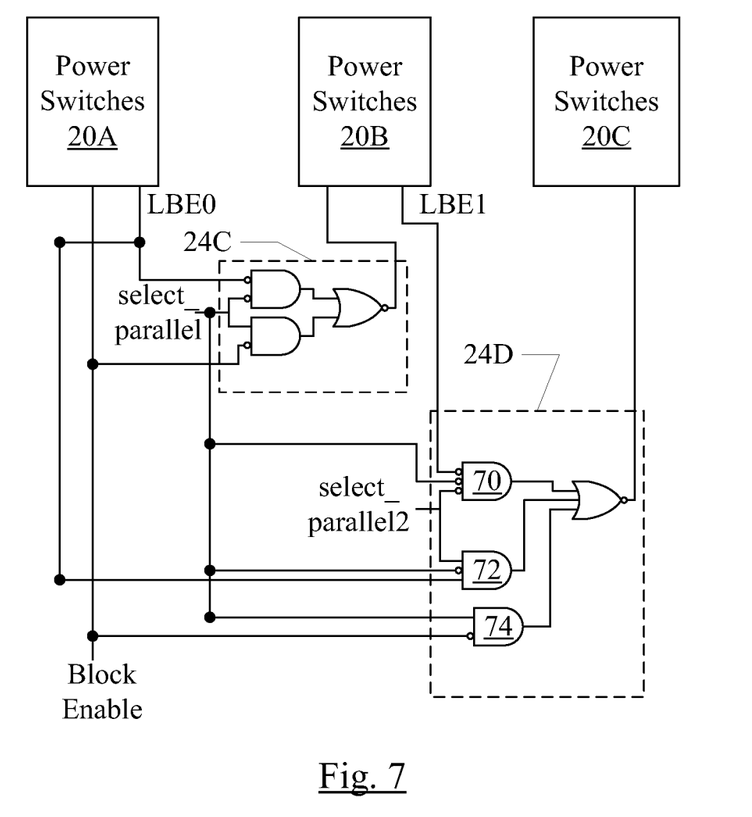
FIG. 7 is a block diagram illustrating another embodiment of power switches and corresponding enable control circuits for a power gated block.

FIG. 7 is a block diagram of another embodiment of enable control circuits, including enable control circuit 24C similar to the enable control circuit 24A but generating a local block enable for the power switch segment 20B responsive to a local block enable signal LBE0 propagated from the power switch segment 20A, the global block enable signal, and the select- _parallel signal. An enable control circuit 24D is also shown, generating a local block enable signal for the power switch segment 20C responsive to the local block enable signals LBE0 and LBE1, the global block enable signal, the select_parallel signal, and a select_parallel2 signal generated by the power manager 18. Enable control circuits similar to the circuits 24C-24D may generate the local block enables for the power switch segments 20D-20F similar to the power switch segments 20A-20C, respectively. In this embodiment, the local block enable propagating directly from power switch segment 20A to power switch segment 20B (as shown in the embodiment of FIG. 3) is not present, although the local block enable from the power switch segment 20A may control assertion of the local block enable to the power switch segment 20B through the enable control circuit 24C. Similarly, the local block enable propagating directly from the power switch segment 20C to the power switch segment 20D (not shown in FIG. 7) and the local block enable propagating directly from the power switch segment 20E to the power switch segment 20F (not shown in FIG. 7) are not present but may indirectly control assertion through corresponding enable control circuits.

In the embodiment of FIG. 7, the select_parallel2 signal may permit a first level of parallel enabling (e.g. every other power switch segment may be enabled in parallel) and the select_parallel signal may permit a second level of parallel enabling which is even more parallel than the first level (e.g. each power switch segment may be enabled in parallel).

As mentioned previously, the enable control circuit 24C may be similar to the enable control circuit 24A and thus may generate the local block enable for the power switch segment 20B responsive to the received LBE0 signal if the select_parallel signal is deasserted or the global block enable if the select_parallel signal is asserted. The enable control circuit 24D may select the LBE1 signal if both the select_parallel and the select_parallel2 signals are deasserted (AND gate 70). The result of both the select_parallel and the select_parallel2 signals being deasserted is thus a serial enabling of the power switch segments 20A-20C. If the select_parallel2 signal is asserted and the select_parallel signal is deasserted, the enable control circuit 24D may select the LBE1 signal to generate the local block enable for the power switch segment 20C (AND gate 72). If the select_parallel signal is asserted, the enable control circuit 24D may select the global block enable to generate the local block enable for the power switch segment 20C (AND gate 74). Any other circuitry may be used to implement the enable control circuits 24C-24D, including any Boolean equivalents of the circuitry shown.

The ramp rate to power up a power gated block may also be controlled by controlling the drive strength of buffers in the power switch segments 20A-20F, in addition to or as an alternative to controlling ramp rate by enabling power switch segments in series or parallel as discussed above. That is, if the buffers have greater drive strength, the propagation delay of the buffer enable through the series connection of the buffers may be reduced, increasing the ramp rate. The drive strength may generally refer to the ability of the transistors forming the buffer to deliver higher current, with a higher current capacity referred to as a higher drive strength.

Figure 8:
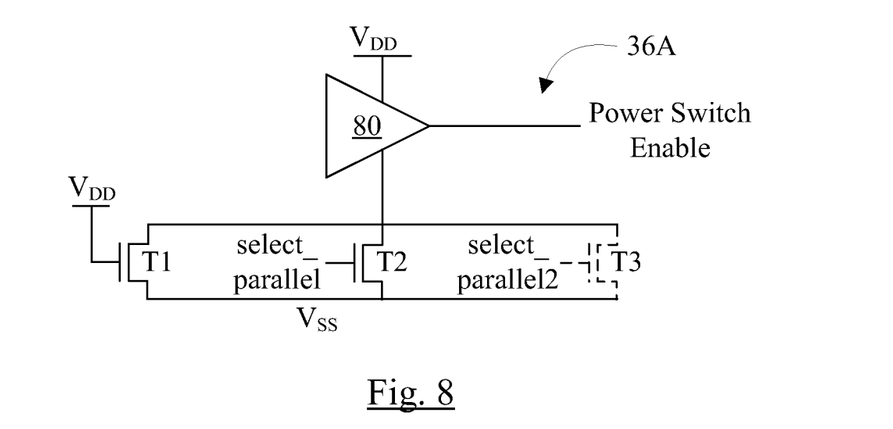
FIG. 8 is a circuit diagram illustrating one embodiment of controlling buffer drive strength.

FIG. 8 illustrates one embodiment of the buffer 36A. Other buffers such as buffer 36B may be similar. In the embodiment of FIG. 8, the buffer 36A may include a buffer circuit 80 (e.g. a series connection of two inverters) coupled to the $V_{DD}$ power supply and coupled to the $V_{SS}$ power supply through two or more transistors connected in parallel (e.g. the transistors T1, T2, and optionally T3. The transistors T1-T3 are NMOS transistors in this embodiment. The transistor T1 has its gate terminal tied to $V_{DD}$, and thus is turned on during use. The transistor T1 thus permits a first drive strength of the buffer 36A. If the select_parallel signal is asserted, the transistor T2 is activated and a second drive strength greater than the first drive strength is permitted (e.g. via the parallel combination of T1 and T2). If the select_parallel2 signal is asserted, a third drive strength is permitted via the parallel combination of T1, T2, and T3). In other embodiments, the drive strength may be controlled using PMOS transistor between $V_{DD}$ and the buffer circuit 80.

Figure 9:
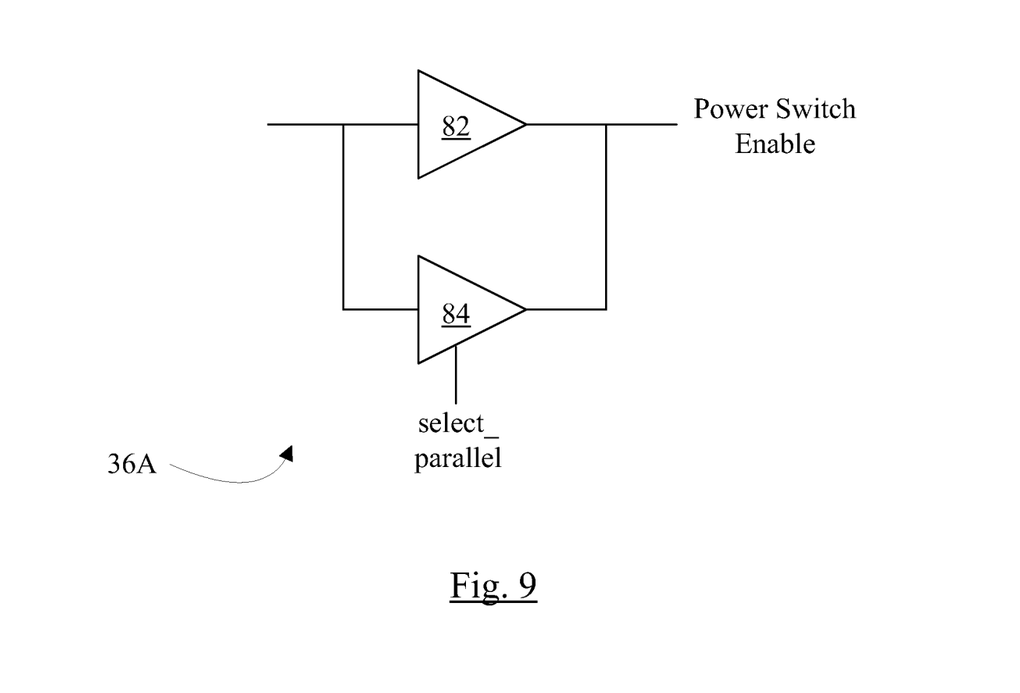
FIG. 9 is a circuit diagram illustrating another embodiment of controlling buffer drive strength.

Drive strength may be controlled in other fashions as well. For example, FIG. 9 illustrates another embodiment of the buffer 36A. Other buffers such as buffer 36B may be similar. In the embodiment of FIG. 9, the buffer 36A includes a first buffer 82 and a second buffer 84 coupled in parallel. The second buffer 84 is tristable, and is controlled by the select_parallel signal. Thus, if the select_parallel signal is asserted, the second buffer 84 may be enabled and the drive strength of the buffer 36A may be increased. If the select_parallel signal is deasserted, then the second buffer 84 is tristated and the driver strength of the buffer 36A is decreased. If additional select_parallel signals are used such as the select_parallel2 signal, additional tristateable buffers similar to the second buffer 84 may be coupled in parallel with the first buffer 82 and the second buffer 84 and controlled by the additional select_parallel signals.

Figure 11:
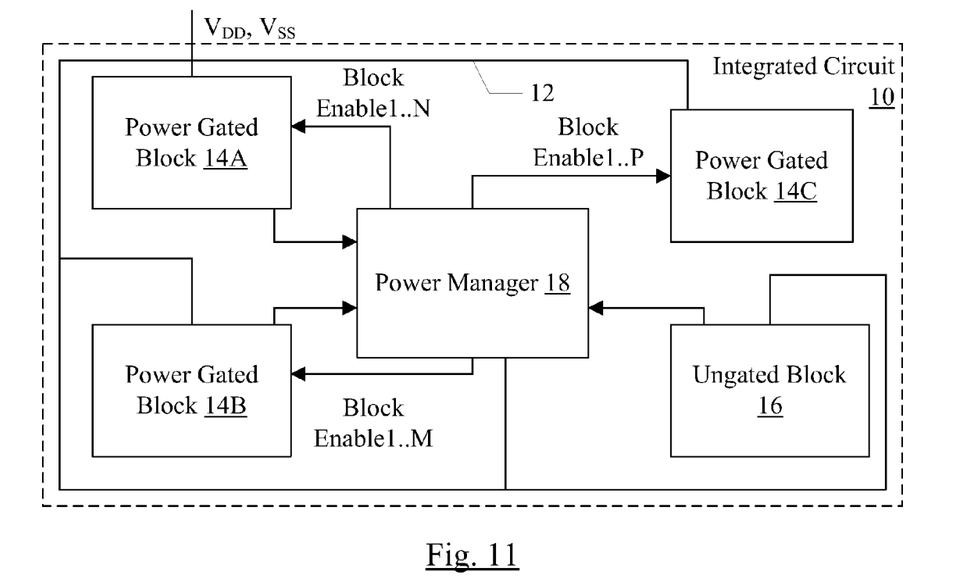
FIG. 11 is a block diagram of another embodiment of an integrated circuit.

Turning next to FIG. 11, a block diagram of another embodiment of the integrated circuit 10 is shown. Similar to FIG. 1, the embodiment of FIG. 11 includes the power gated blocks 14A-14C, the ungated block 16, and the power manager 18. In this embodiment, however, the power manager is configured to provide a set of block enables to the power gated blocks (e.g. N enables to the power gated block 14A, M enables to the power gated block 14B, and P enables to the power gated block 14C, where N, M, and P are integers). The number of block enables provided to the power gated blocks may vary from block to block based, e.g., on the size of the block, the number of power switch segments in the block, etc.

In this embodiment, the power manager 18 may assert the block enables to a power gated block 14A-14C to power up the block. In cases that the PVT parameters indicate faster operation, the power manager 18 may stagger the assertion of the block enables in time. For example, the power manager 18 implement a timer to determine when to assert each enable, or may receive the propagated block enables back from the power gated blocks 14A-14C and may assert the enables responsive to the preceding enables having successfully propagated to the power switch segments, etc. On the other hand, in cases that the PVT parameters indicate slower operation, the block enables may be asserted in parallel. In still other embodiments, a combination of multiple block enables and one or more select_parallel signals may be used to control the power switch segments.

Figure 12:
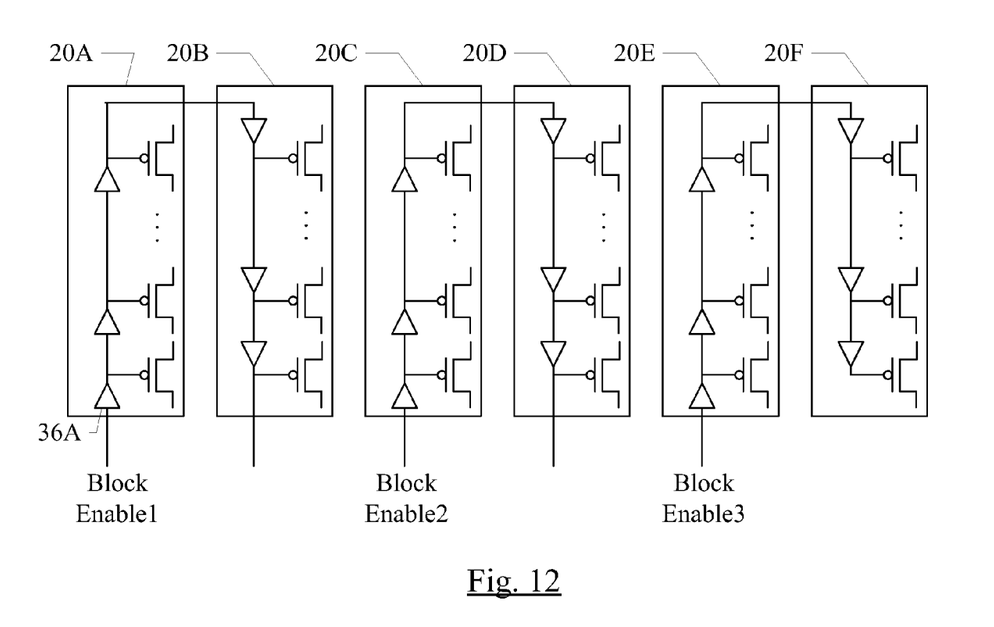
FIG. 12 is a circuit diagram illustrating one embodiment of power switch segments receiving enables shown in FIG. 11.

FIG. 12 is a circuit diagram illustrating one embodiment of the power switch segments 20A-20F coupled to receive block enable1, block enable2, and block enable3. The illustrated embodiment controls the power switch segments 20A-20B with block enable1; controls the power switch segments 20C-20D with block enable2; and controls power switch segments 20E-20F with block enable3. Other embodiments may use more block enables (e.g. one block enable per power switch segment 20A-20F, or more than one block enable per power switch segment 20A-20F).

Figure 10:
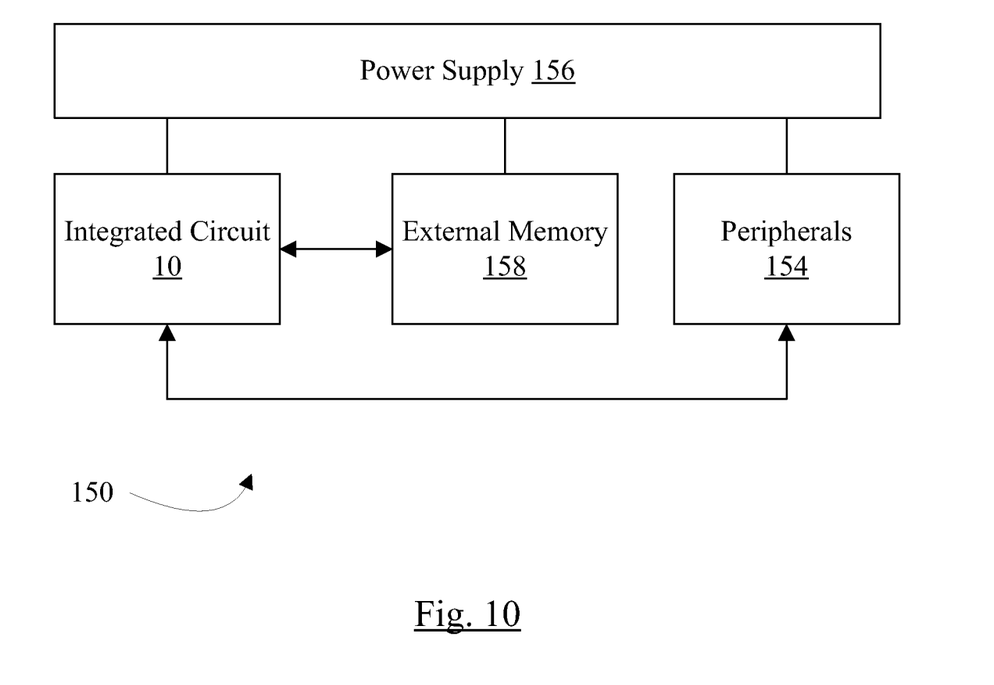
FIG. 10 is a block diagram of one embodiment of a system including the apparatus illustrated in FIG. 1.

Turning next to FIG. 10, a block diagram of one embodiment of a system 150 is shown. In the illustrated embodiment, the system 150 includes at least one instance of an integrated circuit 10 (from FIG. 1 or FIG. 11) coupled to one or more peripherals 154 and an external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

A computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. A computer accessible storage medium may store instructions which, when executed on a processor in the integrated circuit 10 or coupled to the integrated circuit 10, implement various operations described for the software. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A power gated circuit block comprising:
a plurality of power switches, each power switch controlled by one of a plurality of local block enable signals; and
a plurality of enable control circuits coupled to receive a global block enable signal for the power gated circuit block and at least one select signal for the power gated circuit block, and wherein each of the plurality of enable control circuits are coupled to receive at least one of the plurality of local block enable signals, and wherein the plurality of enable control circuits are configured to generate respective local block enable signals of the plurality of local block enable signals responsive to the global block enable signal, the at least one select signal, and the received local block enable signal.

2. The power gated circuit block as recited in claim 1 wherein the plurality of enable control circuits are configured to assert the respective local block enable signal responsive to assertion of a first select signal from the at least one select signal and assertion of the global block enable signal received at the plurality of enable control circuits.

3. The power gated circuit block as recited in claim 2 wherein the plurality of enable control circuits are configured to assert the respective local block enable signal responsive to deassertion of the first select signal and assertion of the received local block enable signal.

4. The power gated circuit block as recited in claim 1 wherein the plurality of enable control circuits and configured to select between the received local block enable signal and the global block enable signal responsive to the at least one select signal.

5. A power gated circuit block comprising:
a plurality of power switch segments, each of the plurality of power switch segments comprising a plurality of power switches; and
at least one enable control circuit coupled to the plurality of power switch segments and coupled to receive a block enable signal for the power gated circuit block and one or more select signals for the circuit block, wherein the enable control circuit is configured to cause two or more of the plurality of power switch segments to be enabled in parallel responsive to an assertion of the block enable and an assertion of at least one of the one or more select signals, and wherein the at least one enable control circuit is configured to cause the plurality of power switch segments to be enabled in series responsive to assertion of the block enable signal and deassertion of the one or more select signals.

6. The power gated circuit block as recited in claim 5 wherein the plurality of power switch segments further comprise a plurality of buffers coupled in series and to receive a control signal from the at least one enable control circuit, wherein the plurality of buffers are further coupled to receive the one or more select signals, wherein a drive strength of the plurality of buffers is controlled by the one or more select signals.

7. The power gated circuit block as recited in claim 6 wherein the drive strength in response to assertion of the one or more select signals is greater than the drive strength in response to deassertion of the one or more select signals.

8. The power gated circuit block as recited in claim 6 wherein each of the plurality of buffers comprises a first transistor coupled between a power supply of the plurality of buffers and buffer circuitry in the plurality of buffers, wherein the first transistor is coupled to a power supply to ensure that the first transistor is on during use, and wherein each of the plurality of buffers comprises a second transistor in parallel with the first transistor, wherein the second transistor is coupled to be on in response to assertion of the one or more select signals and to be off in response to deassertion of the one or more select signals.

9. The power gated circuit block as recited in claim 8 wherein the buffer circuitry comprises a pair of inverters.

10. The power gated circuit block as recited in claim 5 wherein a first power switch segment of the plurality of power switch segments is coupled to receive the block enable signal directly.

11. An integrated circuit comprising:
   a power manager circuit configured to generate a block enable signal and one or more select signals for a power gated block; and
   the power gated block coupled to receive the block enable signal and the one or more select signals for the power gated block, wherein the power gated block includes a plurality of power switches coupled between a power supply of the power gated block and circuitry within the power gated block, wherein the power gated block is configured to control a rate at which the plurality of power switches are enabled responsive to the block enable signal and the one or more select signals.

12. The integrated circuit as recited in claim 11 wherein the rate is increased responsive to assertion of at least one of the one or more select signals compared to the rate responsive to deassertion of the one or more select signals.

13. The integrated circuit as recited in claim 11 wherein a plurality of the plurality of power switches are coupled to receive local enable signals generated within the power gated block, wherein each local enable signal is generated responsive to the block enable signal and the one or more select signals.

14. The integrated circuit as recited in claim 13 wherein at least a subset of the local enable signals are generated further responsive to other ones of the local enable signals.

15. The integrated circuit as recited in claim 11 wherein the power gated block includes buffer circuitry coupled to the plurality of power switches and configured to control an on/off state of the plurality of power switches, wherein a drive strength of the buffer circuitry is controlled responsive to the one or more select signals.

16. A method comprising:
   detecting one or more parameters that affect an operation speed of circuitry in an integrated circuit;
   responsive to the one or more parameters, generating one or more select signals;
   determining that a power gated block is to be enabled;
   asserting a global block enable signal responsive to determining that the power gated block is to be enabled; and
   controlling a delay to enable the power gated block responsive to the one or more parameters, wherein controlling the delay comprises generating a plurality of local block enable signals, wherein each of the plurality of local block enable signals is configured to control respective power switches of a plurality of power switches, and wherein the plurality of local block enable signals are generated responsive to the one or more select signals and the global block enable signal.

17. The method as recited in claim 16 wherein the one or more parameters comprise a supply voltage magnitude.

18. The method as recited in claim 16 wherein the one or more parameters comprise a temperature of the integrated circuit.

19. The method as recited in claim 16 wherein the one or more parameters comprise a process corner that was in effect in the semiconductor fabrication process used to fabricate the integrated circuit.

20. The method as recited in claim 16 wherein a first local block enable signal of the plurality of local block enable signals is generated responsive to the global block enable signal, the one or more select signals, and a second local block enable of the plurality of local block enable signals.

21. The method as recited in claim 16 wherein controlling the delay further comprises controlling a drive strength of buffer circuitry used to buffer the plurality of local block enable signals to the plurality of power switches in the power gated block.

22. A power gated block comprising:
   a first power segment controlled by a global block enable signal to the power gated block, wherein a first local block enable signal is output by the first power segment responsive to propagating the global block enable signal;
   a second power segment coupled to receive a second local block enable signal; and
   a first enable control circuit coupled to receive the first local block enable signal, the global block enable signal, and at least one select signal, wherein the first enable circuit is configured to generate the second local block enable signal responsive to the first local block enable signal and the select signal being deasserted, and wherein the first enable circuit is configured to generate the second local block enable signal responsive to the global block enable signal and the select signal being asserted.

23. An integrated circuit comprising:
   a power manager circuit configured to generate a plurality of block enable signals for a power gated block; and
   the power gated block coupled to receive the block enable signals, wherein the power gated block includes a plurality of power switches coupled between a power supply of the power gated block and circuitry within the power gated block, wherein each of the plurality of power switches is enabled responsive to one of the plurality of block enables, and wherein the power manager circuit is configured to control a rate at which the plurality of power switches are enabled by controlling assertion of the plurality of block enables responsive to one or more process, voltage, and temperature parameters.

* * * * *